United States Patent
Kalnitsky et al.

(10) Patent No.: US 11,063,080 B2
(45) Date of Patent: *Jul. 13, 2021

(54) IMPLANT DAMAGE FREE IMAGE SENSOR AND METHOD OF THE SAME

(71) Applicant: TAIWAN SEMICONDUCTOR MANUFACTURING COMPANY LTD., Hsinchu (TW)

(72) Inventors: Alexander Kalnitsky, San Francisco, CA (US); Jhy-Jyi Sze, Hsin-Chu (TW); Dun-Nian Yaung, Taipei (TW); Chen-Jong Wang, Hsinchu County (TW); Yimin Huang, Hsinchu (TW); Yuichiro Yamashita, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,698

(22) Filed: Jun. 8, 2020

(65) Prior Publication Data
US 2020/0303431 A1    Sep. 24, 2020

Related U.S. Application Data

(63) Continuation of application No. 16/241,582, filed on Jan. 7, 2019, now Pat. No. 10,692,914, which is a (Continued)

(51) Int. Cl.
H01L 27/146 (2006.01)

(52) U.S. Cl.
CPC ...... *H01L 27/1463* (2013.01); *H01L 27/1464* (2013.01); *H01L 27/14636* (2013.01);
(Continued)

(58) Field of Classification Search
CPC ............ H01L 27/1463; H01L 27/1464; H01L 27/14636; H01L 27/14689; H01L 27/14621; H01L 27/14627
See application file for complete search history.

(56) References Cited

U.S. PATENT DOCUMENTS

| 6,080,640 A * | 6/2000 | Gardner ............ H01L 21/76801 |
| | | 438/455 |
| 9,293,626 B2 * | 3/2016 | Jonak-Auer ............ H01L 31/18 |

* cited by examiner

*Primary Examiner* — Dale E Page
*Assistant Examiner* — Quovaunda Jefferson
(74) *Attorney, Agent, or Firm* — WPAT, P.C., Intellectual Property Attorneys; Anthony King

(57) ABSTRACT

An image sensor is disclosed. The image sensor includes an epitaxial layer, a plurality of plug structures and an interconnect structure. Wherein the plurality of plug structures are formed in the epitaxial layer, and each plug structure has doped sidewalls, the epitaxial layer and the doped sidewalk form a plurality of photodiodes, the plurality of plug structures are used to separate adjacent photodiodes, and the epitaxial layer and the doped sidewalls are coupled to the interconnect structure via the plug structures. An associated method of fabricating the image sensor is also disclosed. The method includes: providing a substrate having a first-type doped epitaxial substrate layer on a second-type doped epitaxial substrate layer; forming a plurality of isolation trenches in the first-type doped epitaxial substrate layer; forming a second-type doped region along sidewalk and bottoms of the plurality of isolation trenches; and filling the plurality of isolation trenches by depositing metal.

20 Claims, 18 Drawing Sheets

Related U.S. Application Data continuation of application No. 14/724,055, filed on May 28, 2015, now Pat. No. 10,177,187.

(52) U.S. Cl.
CPC .. *H01L 27/14689* (2013.01); *H01L 27/14621* (2013.01); *H01L 27/14627* (2013.01)

IMPLANT DAMAGE FREE IMAGE SENSOR AND METHOD OF THE SAME

CROSS-REFERENCE TO RELATED APPLICATIONS

This application is a continuation of U.S. application Ser. No. 16/241,582, filed on Jan. 7, 2019, which is a continuation of U.S. application Ser. No. 14/724,055, filed on May 28, 2015. All of the above-referenced applications are hereby incorporated herein by reference in their entirety.

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, so as to absorb radiation projected toward the substrate and convert the sensed radiation into electrical signals.

In recent years, the semiconductor integrated circuit (IC) industry has experienced rapid growth. Technological advances in IC materials and design have produced generations of ICs where each generation has smaller and more complex circuits than the previous generation. As a part of the IC evolution for semiconductor image sensors, the size of the radiation-sensitive pixels has been steadily reduced. As the pixels and the separation between adjacent pixels continue to shrink, issues such as excessive dark current and cross-talk become more difficult to control. Conventional methods of addressing the dark current and cross-talk issues, such as deep trench isolation (DTI), require conducting an implant operation, which is likely to cause damage on the image sensor and is confined by an implant depth limitation. As such, additional defects and interference may be induced. It would therefore be desirable to be able to provide improved image sensor for capturing images.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
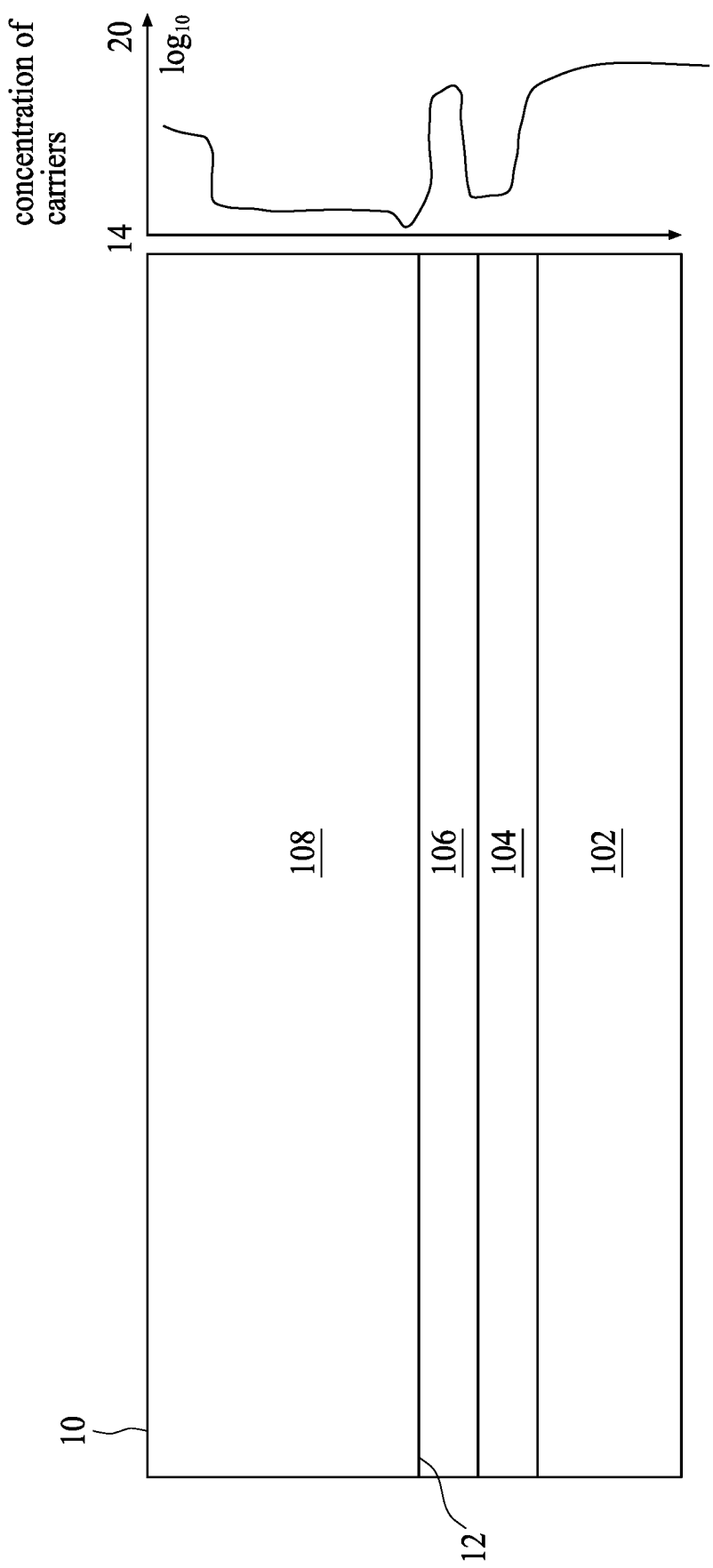
FIGS. 1 to 18 are diagrammatic fragmentary cross-sectional views of a back side illuminated (BSI) image sensor at various stages of fabrication according to a preferred embodiment of the disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1 to 17 are diagrammatic fragmentary cross-sectional views of a back side illuminated (BSI) image sensor at various stages of fabrication according to a preferred embodiment of the disclosure. The BSI image sensor includes an array or grid of pixels for sensing and recording an intensity of radiation (such as light) directed toward a back-side of the 1351 image sensor. In some embodiments, the BSI image sensor may include a complementary metal oxide semiconductor (CMOS) image sensor (CIS), an active-pixel sensor (APS), or a passive-pixel sensor. The BSI image sensor further includes additional circuitry and input/outputs that are provided adjacent to the grid of pixels for providing an operation environment for the pixels and for supporting external communication with the pixels. It is understood that FIGS. 1 to 17 have been simplified for a better understanding of the inventive concepts of the present disclosure and may not be drawn to scale.

With reference to FIG. 1, a substrate 102 is provided. The substrate 102 is a silicon substrate doped with a p-type dopant such as Boron, and thus serves as a p-type substrate. Alternatively, the substrate 102 includes another suitable semiconductor material. For example, the substrate 102 may be a silicon substrate that is doped with an n-type dopant such as phosphorous or arsenic, and thus serves as an n-type substrate. Moreover, the substrate 102 may include other elementary semiconductors such as germanium and diamond. The substrate 102 may optionally include a compound semiconductor and/or an alloy semiconductor. In this embodiment, a lightly doped p-type epitaxial layer (p-epi layer) 104 and a heavily doped p-epi layer 106 are consecutively formed over a front side of the substrate 102. On the heavily doped p-epi layer 106, an n-type epitaxial layer (n-epi layer) 108 is formed.

Please note that dopant concentration of each layer is illustrated by a plot beside the layers 102 to 108, wherein the dopant concentration is indicated by its logarithm value to base 10. For instance, p-type dopant concentration of the substrate 102 and the heavily doped p-epi layer 106 is greater than about $10^{18}$ cm$^{-3}$; p-type dopant concentration of the lightly doped p-epi layer 104 is less than about $10^{16}$ cm$^{-3}$; and n-type dopant concentration of the n-epi layer 108 is from about $10^{14}$ cm$^{-3}$ to about $10^{17}$ cm$^{-3}$.

The n-epi layer 108 has a front side (also referred to as a front surface) 10 and a back side (also referred to as a back surface) 12. For a BSI image sensor such as the image sensor of the present embodiment, radiation is projected from the back side 12 after thinning down and enters the remaining epi layer through the back surface 12. In an embodiment, an initial thickness of the substrate 102 is from about 800 microns (um) to about 1000 um; an initial thickness of the lightly doped p-epi layer 104 is from about 0.1 um to about 0.3 um; an initial thickness of the heavily doped p-epi layer 106 is from about 0.1 um to about 0.2 um; and an initial thickness of the n-epi layer 108 is from about 2.5 um to about 15 um. The dimensions described above are exemplary only and the layers 102 to 108 are not limited thereto in the present disclosure. Similar structures applied in other applications also fall within the contemplated scope of the present disclosure.

Figure 2:
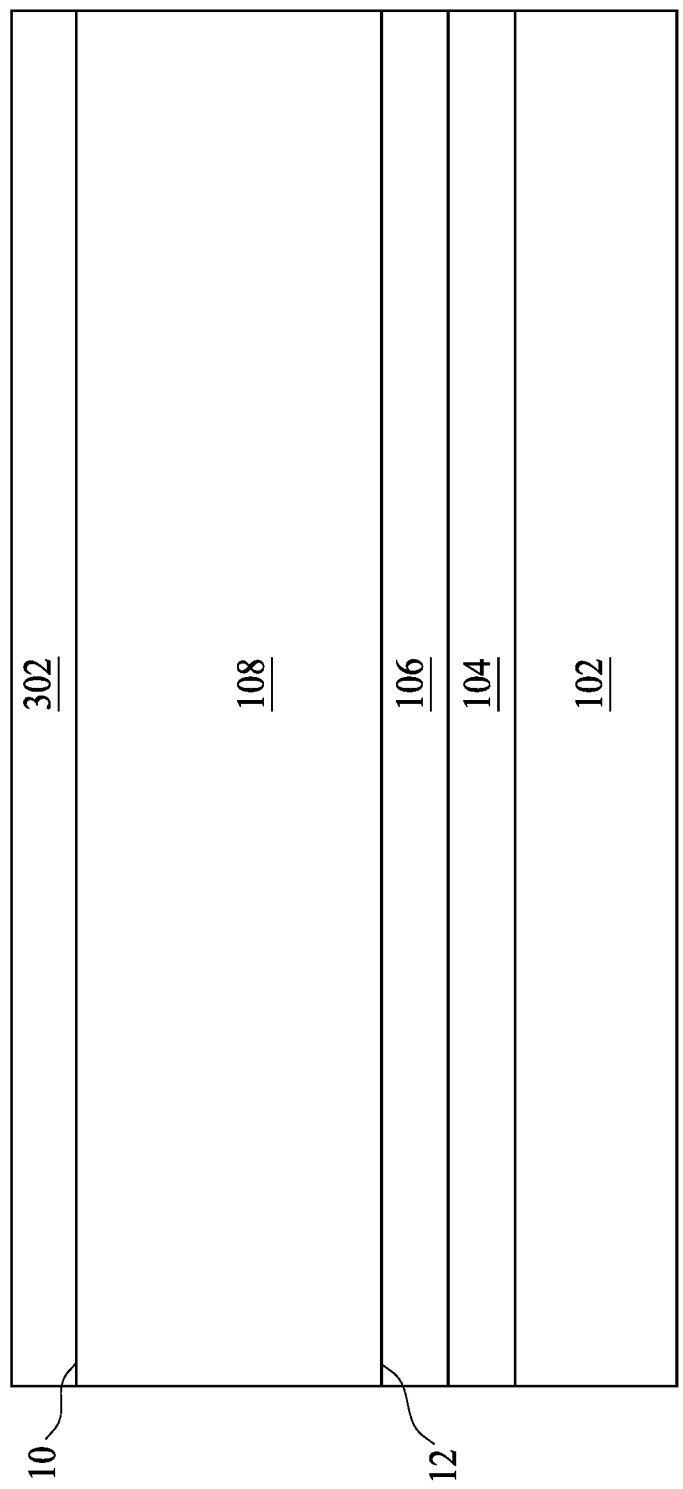

Referring to FIG. 2, a thermal oxidation layer 302 is formed on the front side 10 of the n-epi layer 108 through a thermal oxidation operation at a temperature ranging from approximately 800° C. to approximately 1050° C. using one of oxygen ($O_2$) gas and water ($H_2O$) gas. A thickness of the thermal oxidation layer 302 may be of a range approximately from 100 to 1000 angstrom. However, this is not a limitation of the present disclosure.

Figure 3:

Next, as shown in FIG. 3, a photo resist pattern 402 is formed over the thermal oxidation layer 302, The photo resist pattern 402 serves as an etching mask for a subsequent etching step. In particular, the photo resist pattern 402 leaves a portion of the thermal oxidation layer 302 exposed.

Figure 4:
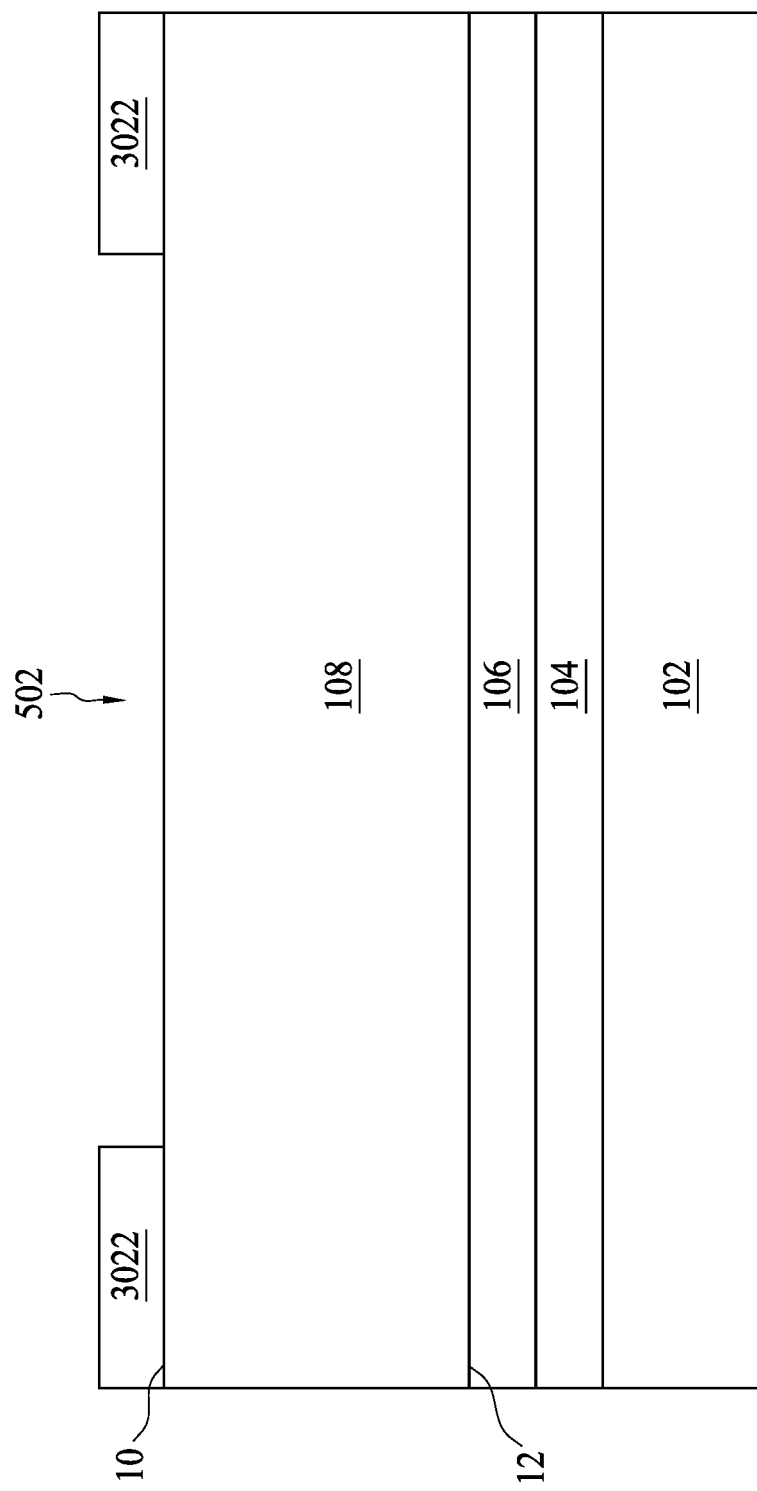

Referring to FIG. 4, the thermal oxidation layer 302 is isotropically etched to form an opening 502. For example, the isotropic etching may be carried out by wet-etching the thermal oxidation layer 302, using a hydroflourine (HF) based etchant. In this example, the etchant has selectivity such that the photo resist pattern 402 is not attacked. The etch time and etch rate of the etchant may be controlled to achieve a desired radius of curvature for the concavity and therefore, are a matter of design choice. After etching, the photo resist pattern 402 is removed, resulting in a patterned thermal oxidation layer 3022.

Figure 5:
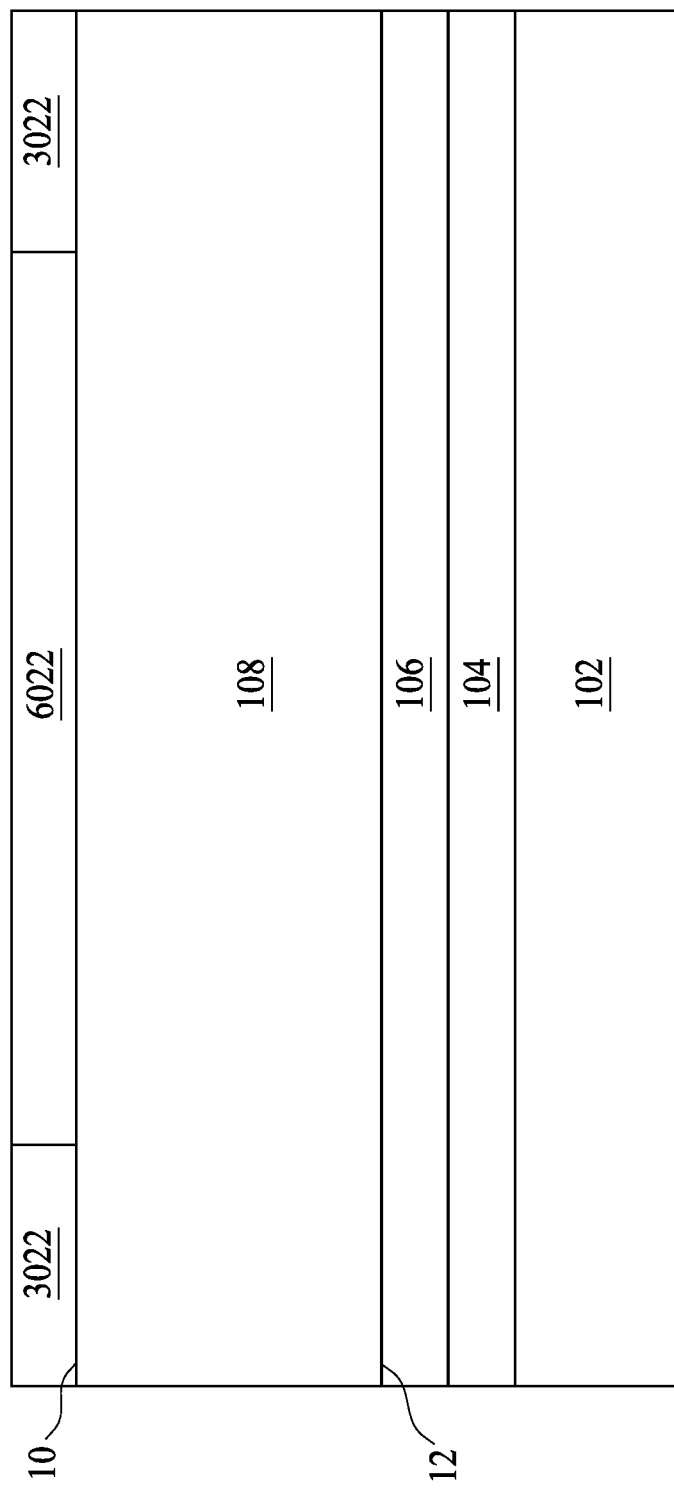
Figure 6:
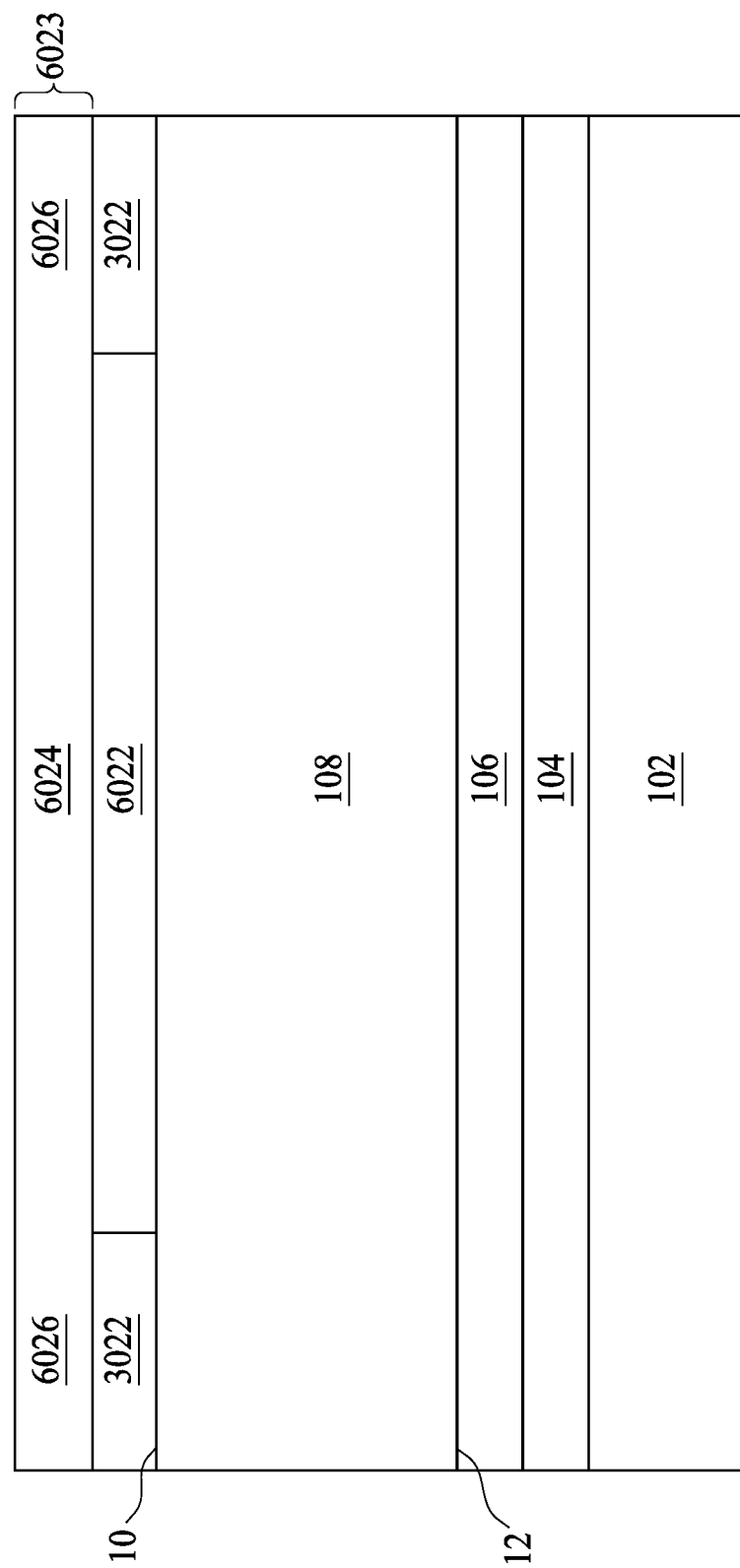
Figure 7:
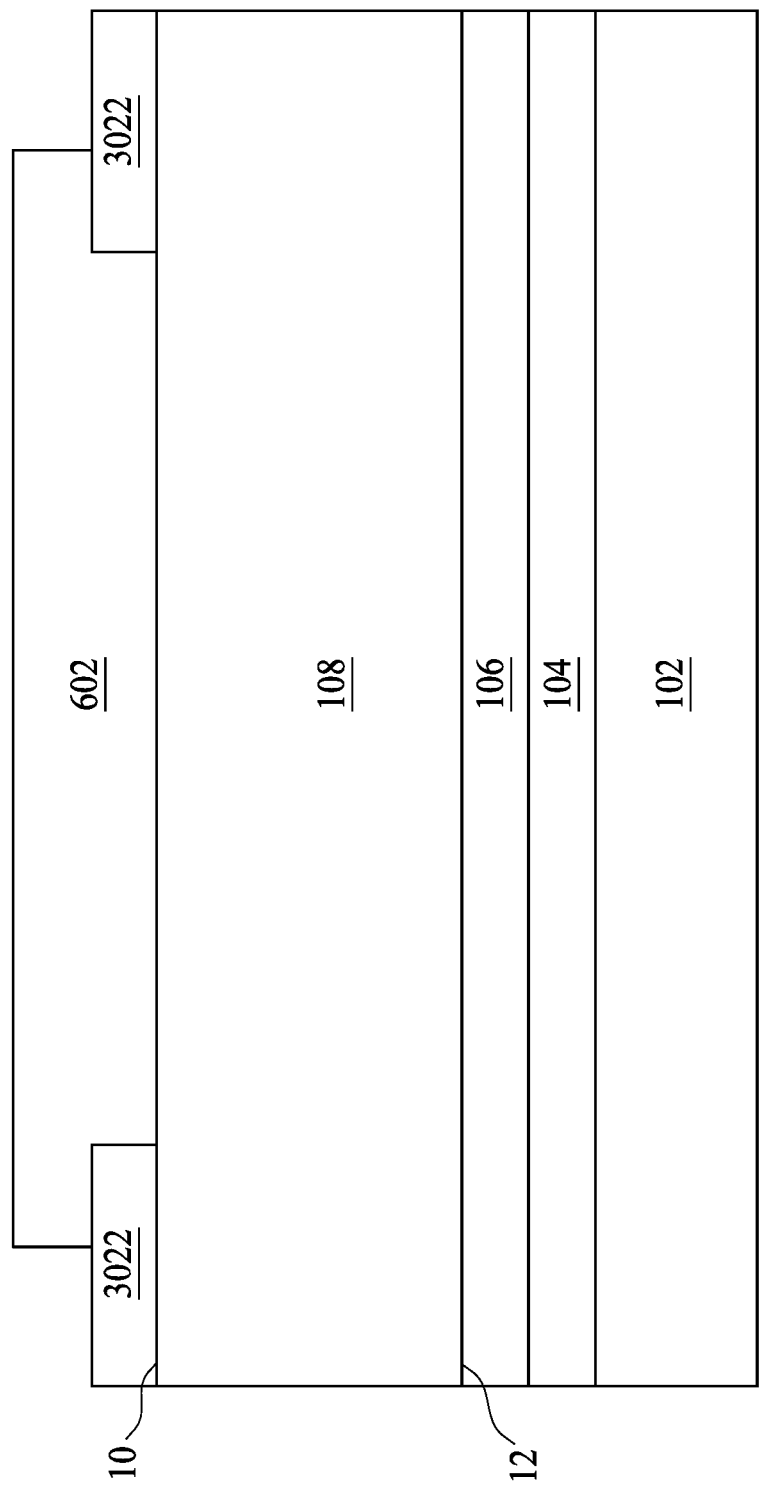

Next, a heavily doped n-epi layer is deposited. The deposition may be produced by two consecutive steps, including a selectively in-situ doping step followed by a non-selective in-situ doping step. FIG. 5 shows the structure of the BSI image sensor after deposition of a selectively in-situ doped n-epi layer 6022. In specific, n-type epitaxy is selectively formed on the n-epi layer 108 in the opening 502. After the opening 502 is substantially filled by n-type epitaxy, the non-selective in-situ doping step is performed to cover the patterned thermal oxidation layer 3022 and the selectively in-situ doped n-type epitaxy 6022 by n-type polysilicon and n-type epitaxy of a certain thickness, so as to complete the formation of the n-epi layer. FIG. 6 shows the structure of the BSI image sensor after deposition of a non-selectively in-situ doped n-epi layer 6023. The non-selectively in-situ doped n-epi layer 6023 includes n-type polysilicon regions 6026 and an n-type epitaxy region 6024. The selectively in-situ doped n-type epitaxy 6022 and the non-selectively in-situ doped n-epi layer 6023 are commonly referred to be an n-epi layer 602 for brevity. In some embodiments, the n-epi layer 602 may be alternatively produced by using a split poly approach followed by an ion implant step. Subsequently, as shown in FIG. 7, a portion of the n-epi layer 602, particularly the polysilicon portion above the patterned thermal oxidation layer 3022, is etched away through an etching operation according to a photo resist pattern applied thereto.

Figure 8:
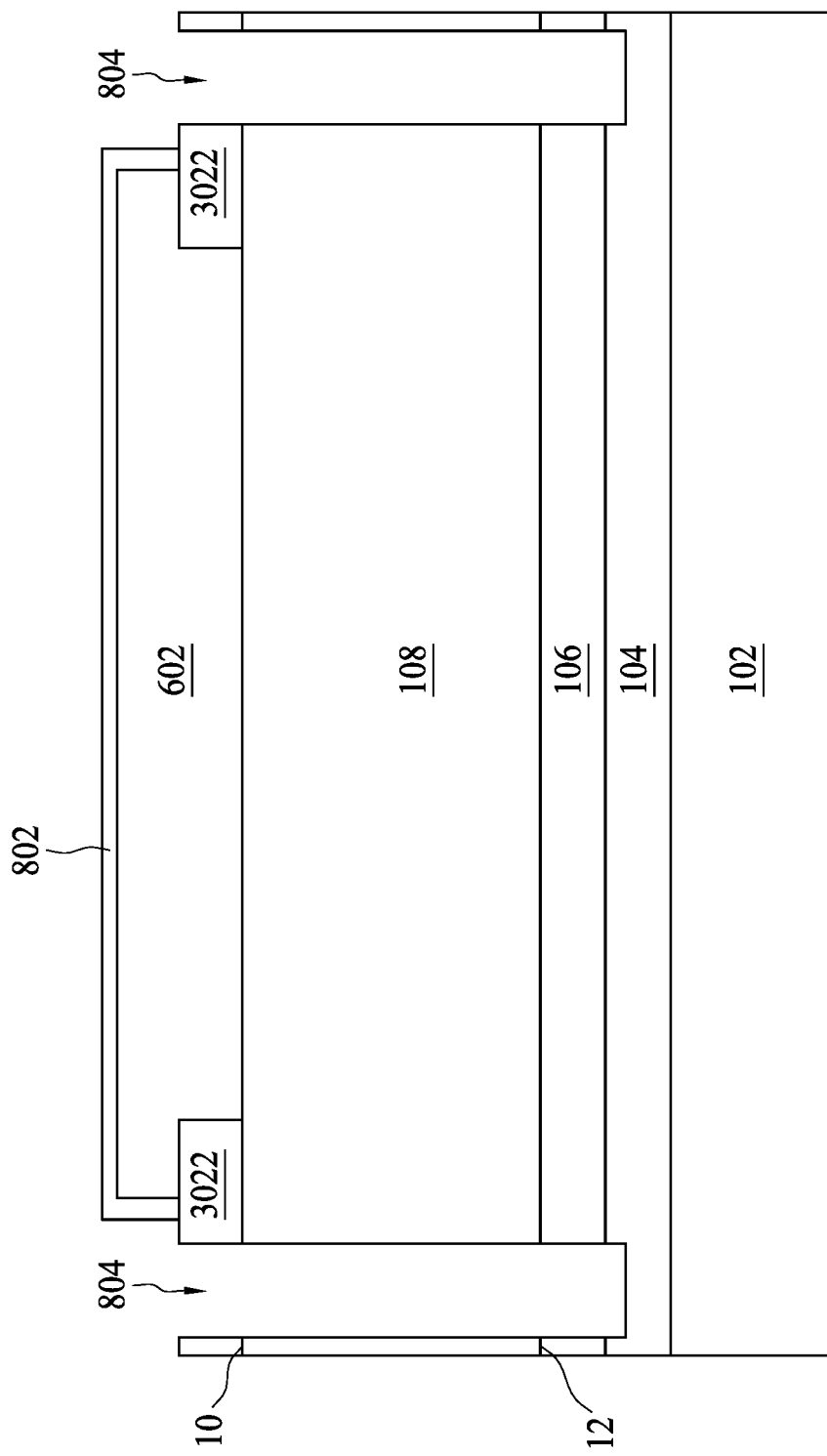

With reference to FIG. 8, an oxidation film 802 having a certain thickness is deposited to cover the n-epi layer 602 by way of a thermal oxidation, a chemical vapor deposition (CVD) process or a plasma enhanced chemical vapor deposition (PECVD) process. An etching process may be performed to obtain front side deep trench isolation (DTI) structures 804 down to the lightly doped p-epi layer 104, thereby isolating photodiodes of each individual pixel. In this embodiment, the etching process includes a dry etching process. An etching mask (for example a hard mask, not illustrated herein) may be formed before the etching process is performed to define the size and location of the DTI structures 804.

Figure 9:
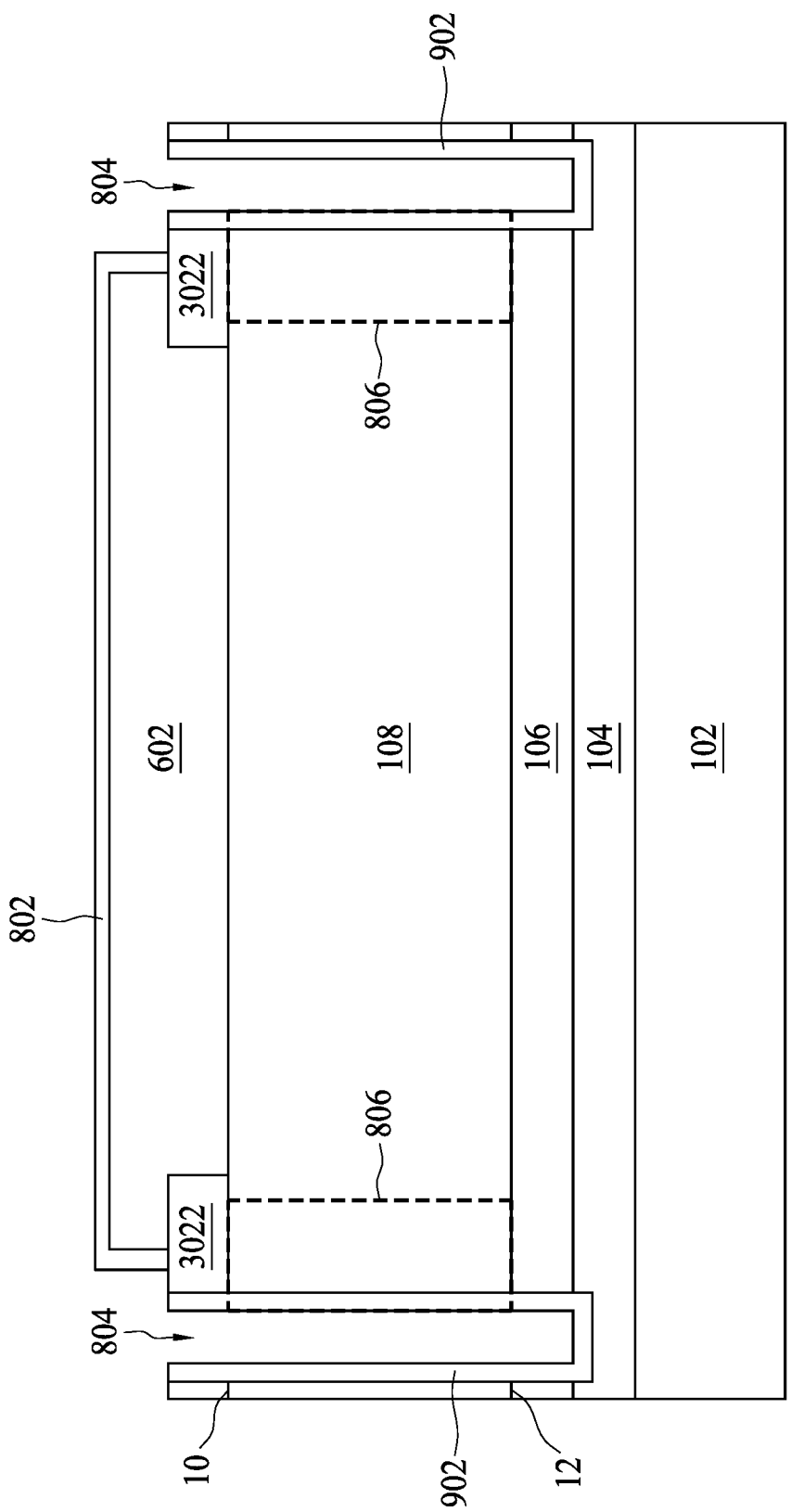

Two of such DTI structures are illustrated in FIG. 8 as the trenches 804 for the sake of providing an illustration. The trenches 804 may be formed to have a rectangular shape, somewhat a trapezoidal shape, or another suitable shape. The trenches 804 go through the patterned thermal oxidation layer 3022, the n-epi layer 108, the heavily doped p-epi layer 106, and extends into the lightly doped p-epi layer 104. Referring now to FIG. 9, an epitaxy growth on the exposed surfaces including the sidewalls and bottoms of the trenches 804 may be implemented by utilizing a silane ($SiH_4$) gas and further another gas (or gases) under a proper pressure to introduce dopants. A p+-epi layer 902 is formed in a conformal manner around the trenches 804 according to one embodiment of the present disclosure. Boundaries or interfaces between the p+-epi layer 902 and the n-epi layer 108 are p-n junctions 806 that form a photodiode structure for an image pixel. The conformal shape of the p+-epi layer 902 may mean that the profile of the p+-epi layer 902 follows or takes on the profile of its corresponding trench 804. The dopants are introduced into the p+-epi layer 902 by in-situ epitaxy growth. In specific, a selective epitaxy operation is employed in the present disclosure. The selective epitaxy operation involves two reactions: deposition and etching. They occur simultaneously at different reaction rates on Si and on dielectric (oxide) surface. An epitaxy operation results in deposition only on Si surfaces and no growth on dielectric areas by changing the concentration of an etchant gas.

The p+-epi layer 902 is a boron doped epitaxy layer according to this embodiment. However, this is not a limitation of the disclosure. Other suitable materials applied in other applications also fall within the contemplated scope of the present disclosure. The boron doped epi layer 902 can be formed near the sidewall and the bottom of the trenches 804 at a concentration of more than about $10^{17}$ cm$^{-3}$. Compared to an existing process, DTI without the use of high energy implants can reduce the chance of introducing defects to the pinned photodiode structure and allows for the formation of a much deeper P-N junction compared to the one formed by ion implantation. Very deep junction may be beneficial for the near infrared (NIR) sensor.

In some embodiments, a solid material may be utilized to carry out dopant diffusion so as to form the conformal-shaped doped layer 902. Where the dopant diffusion is done using a solid material, it may be referred to as a solid phase doping method. For example, dopant-containing layers (not shown in FIG. 9) are first formed on the exposed surfaces (including the sidewalls) of the trenches 804. The dopant-containing layers include Boron-Silicate Glass (BSG). The formation of the BSG material may utilize Tetraethyl Orthosilicate (TEOS) as a precursor. The formation of the BSG material may also involve the use of an Ozone gas (O3). For the Ozone TEOS BSG doping embodiment, a dopant drive-in process may be performed to facilitate dopant diffusion from the dopant-containing layers into the surrounding regions of the tranches 804 because it's a thermal process without Argon or Helium bombardment. In some embodiments, the dopant drive-in process includes a thermal process, such as a Rapid Annealing Process (RTA). The RTA process may be performed at a process temperature greater than about 1000 degrees Celsius for a process duration of about 5 to 15 seconds. As a result of the dopant drive-in process, the p+-type doped layer 902 is formed through the diffusion of the dopant material (e.g., Boron for the illustrated embodiment) from the dopant-containing layers into the surrounding regions of the trenches 804.

In some embodiments, a gas phase doping method may be employed to form the conformal-shaped doped layer 902. To this end, no dopant-containing layer is formed in the trenches 804. A dopant-containing gas is used to diffuse a dopant into regions of the silicon surrounding the trenches 804. Similar to the dopant-containing layer, the dopant-containing gas also includes a dopant material having p-type doping polarity. Thus, in the illustrated embodiment, the dopant-containing gas contains Boron. In some embodiments, the dopant-containing gas includes Triethylborane (TEB). The dopant diffusion from the dopant-containing gas into the regions of the silicon surrounding the trenches 804 also causes the doped regions 902 to be formed in a conformal manner around the trenches 804. Since the dopant diffusion is carried out using a gas material rather than a solid material, the embodiment discussed above may be referred to as a gas phase doping method.

Figure 10:
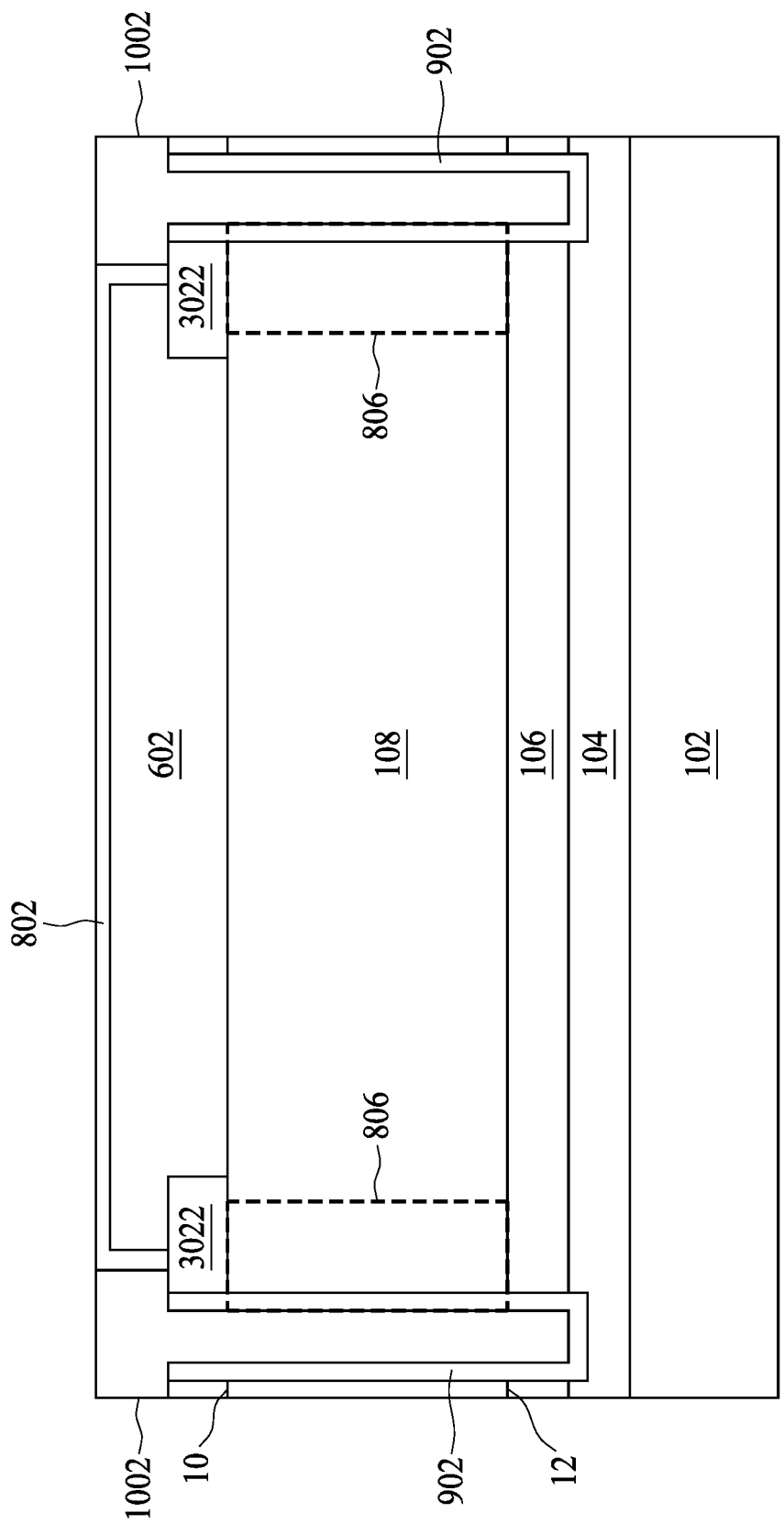

Referring now to FIG. 10, after the high concentration boron doped epi layer 902 is formed using either the selective in-situ operation, solid phase doping method or the gas phase doping method, a dielectric material is deposited to fill the trenches 804 and cover the patterned thermal oxidation layer 3022, resulting in a dielectric region 1002 approximately flush with the oxidation film 802. However, this is not a limitation of the present disclosure. In some embodiments, the dielectric region 1002 may not be flush with the oxidation layer 802. Moreover, the dielectric material mentioned above includes silicon oxide, silicon nitride, silicon oxynitride, a low-k dielectric, or another suitable dielectric material.

Figure 11:
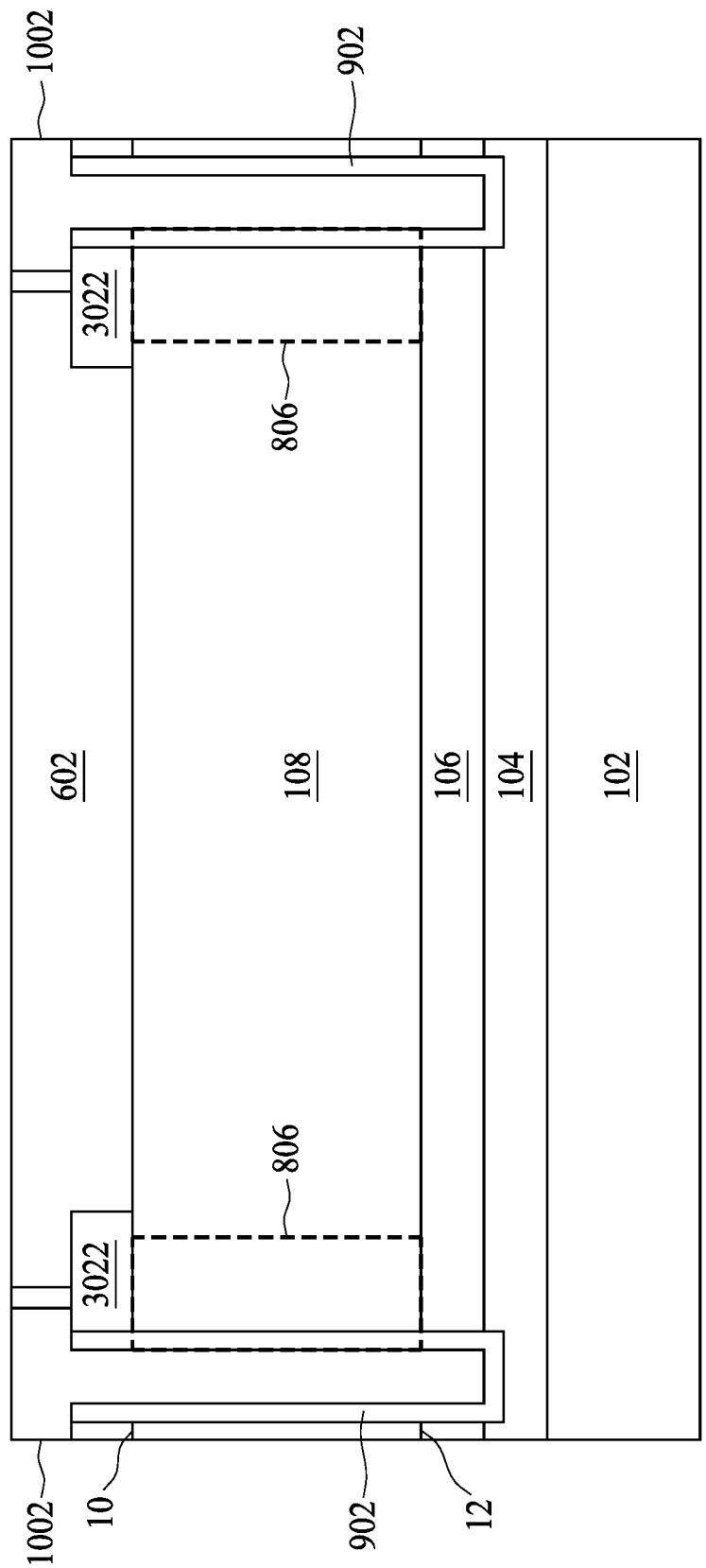

Next, a planarization process (e.g., chemical mechanical polishing, or CMP) or an etching process (e.g., wet etching with dilute aqueous or buffered HF, or selective dry etching using a fluorocarbon etchant) is employed to expose the n-epi layer 602 as depicted in FIG. 11. To this end, a top portion of the oxidation film 802 and the dielectric region 1002 is grounded off or etched away. The n-epi layer 602 includes the polysilicon portions approximately above the patterned thermal oxidation layer 3022 and includes the n-type epitaxy portion formed directly on the n-epi layer 108.

Figure 12:
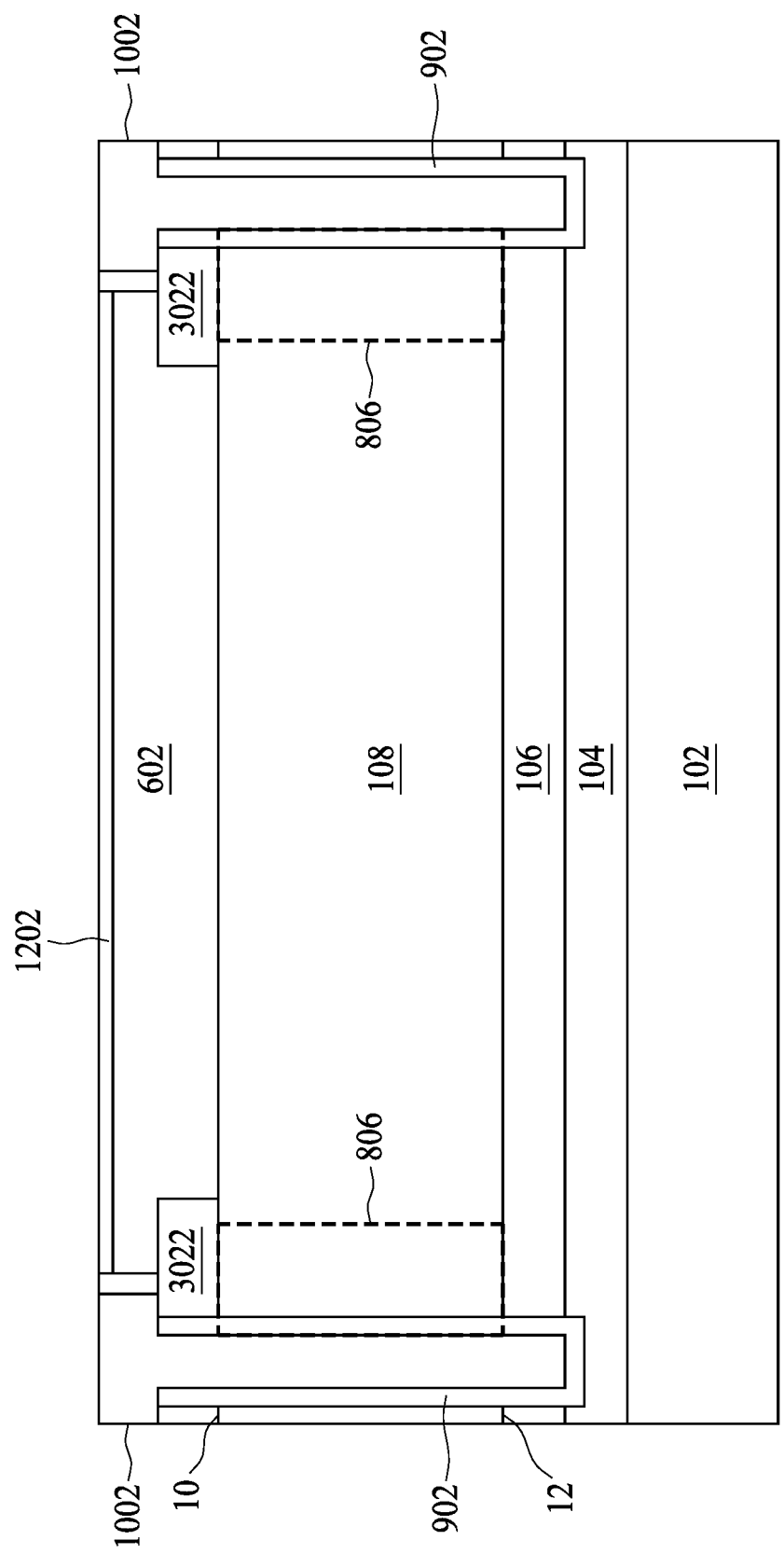
Figure 13:
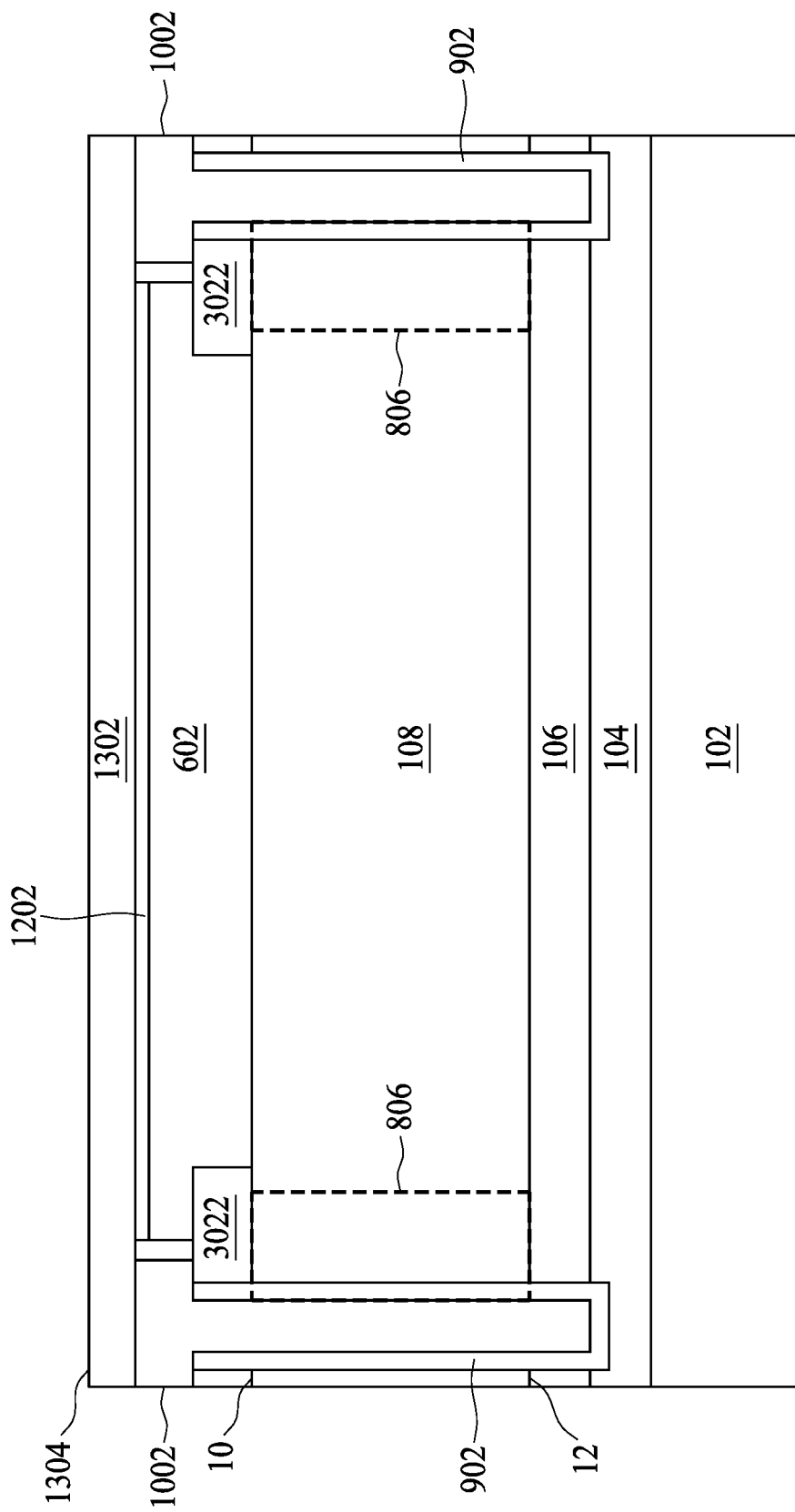

An RTA process may be performed again to drive n-type dopant to diffuse from the p+-type doped layer 902 into neighboring regions of the n-epi layer 108, and to drive p-type dopant to diffuse from the n-epi layer 602 to neighboring regions of the n-epi layer 108. In this way, a graded transition from the p-type doping to the n-type doping is therefore formed; and the heavily doped n-epi layer 602 and the n-epi layer 108 as a whole can therefore become a graded epitaxial layer. A function of the n-epi layer 602 is to provide a contact for a terminal of the p-n junctions 806. To this end, the top surface of the n-epi layer 602 may be further silicided to form a contact silicide 1202. Thereby the conductivity of the n-epi layer 602 can be further increased, which is advantageous to the image sensing operation. Addition of the silicide 1202 may also be beneficial for the absorption of light emitted by active CMOS circuitry under the photo diode pixel. FIG. 12 shows the configuration of the contact silicide 1202 according to an embodiment of the disclosure. After the contact silicide 1202 is formed, another dielectric material 1302 is deposited over the front side of the photo-diode structure in order to cover the n-epi layer 602 as shown in FIG. 13.

Figure 14:
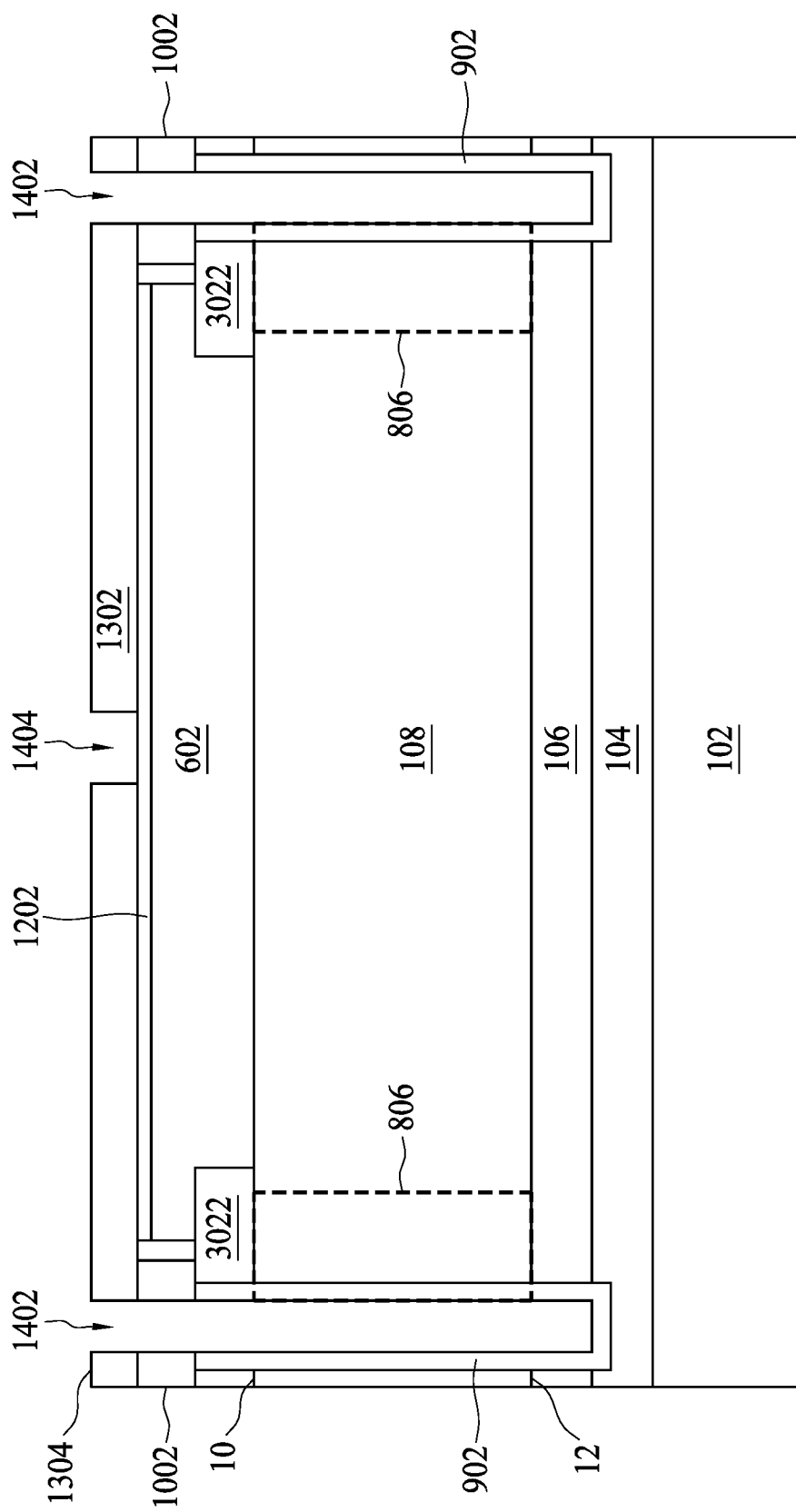
Figure 15:
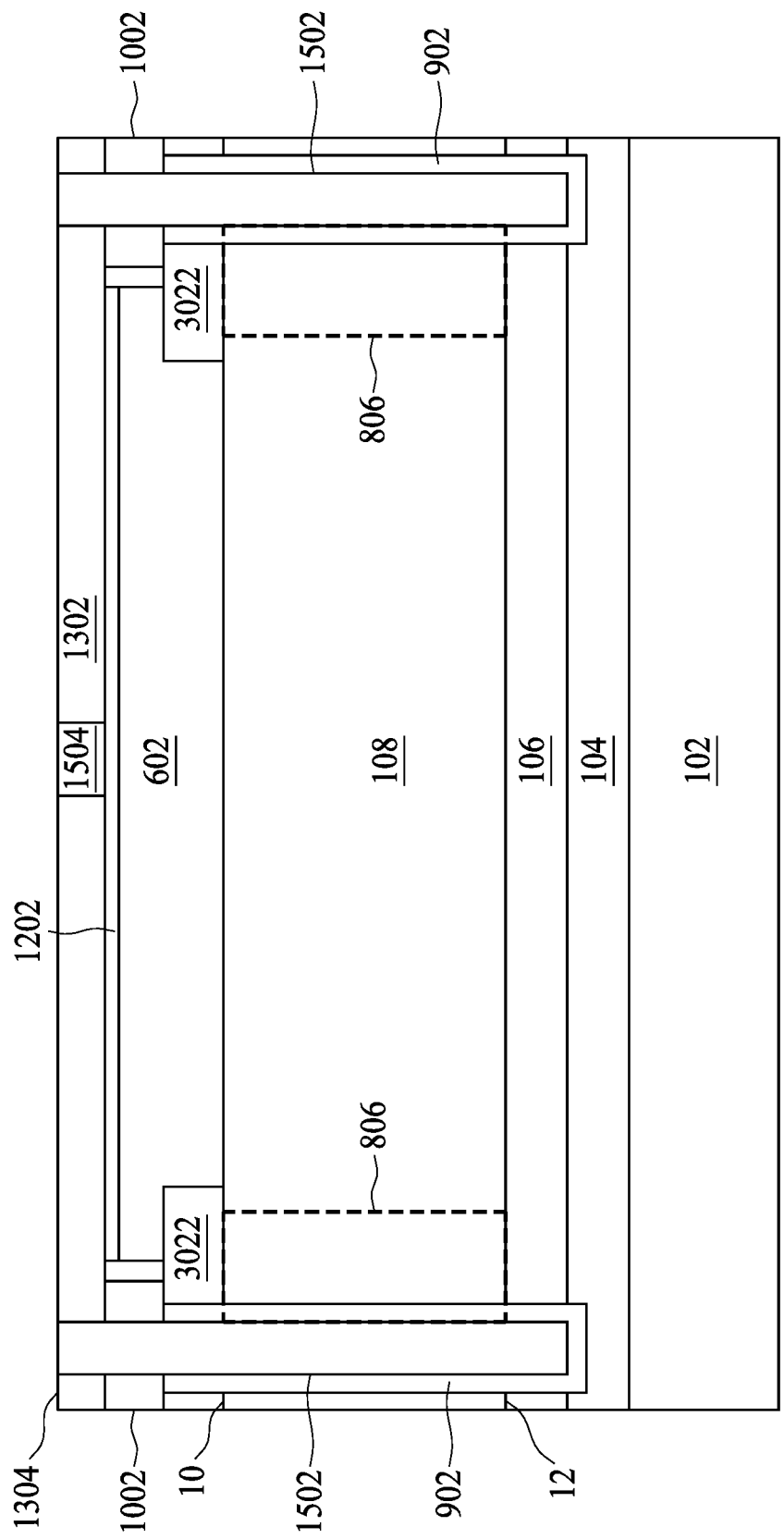

Please refer to FIG. 14. An etching process is performed on a portion of a front side 1304 in order to remove undesired dielectric material, thereby forming deep trenches 1402 and a shallow trench 1404. The p+-epi layer 902 is therefore exposed at side walls and bottoms of the deep trenches 1402. A portion of the contact silicide 1202 is also exposed at a bottom of the shallow trench 1404. After the deep trenches 1402 and the shallow trench 1404 are formed, a liner layer may be applied to a bottom and side walls of the deep trenches 1402 and the shallow trench 1404. Next, the deep trenches 1402 and the shallow trench 1404 are filled by depositing metal, for example, tungsten, forming the metal regions 1502 and 1504 as shown in FIG. 15. The shallow trench 1404 serves as a plug for coupling the p terminal of the p-n junctions 806 to outside circuitry; and the deep trenches 1402 serve as plugs for coupling the n terminal of the p-n junctions 806 to a reference voltage, such as a ground voltage. It should be noted that the etched trench 1402 may also extend just enough to touch the top portion of the n-epi layer 108. In this case, most of the DTI structure 804 is still it with oxide and the p+-epi layer 902 is formed only at the top of the sidewall of the trench 804.

Figure 16:
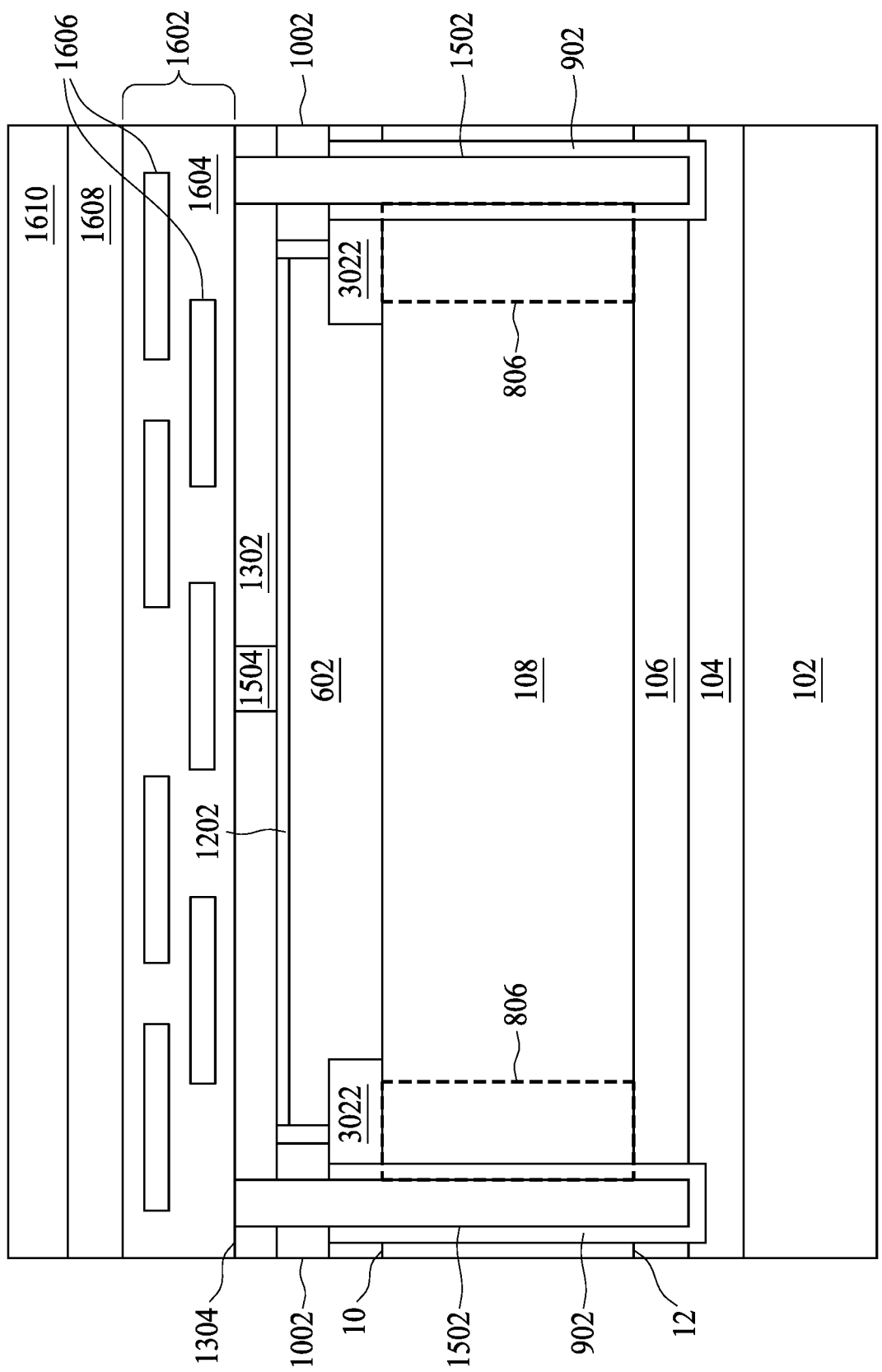
Figure 17:
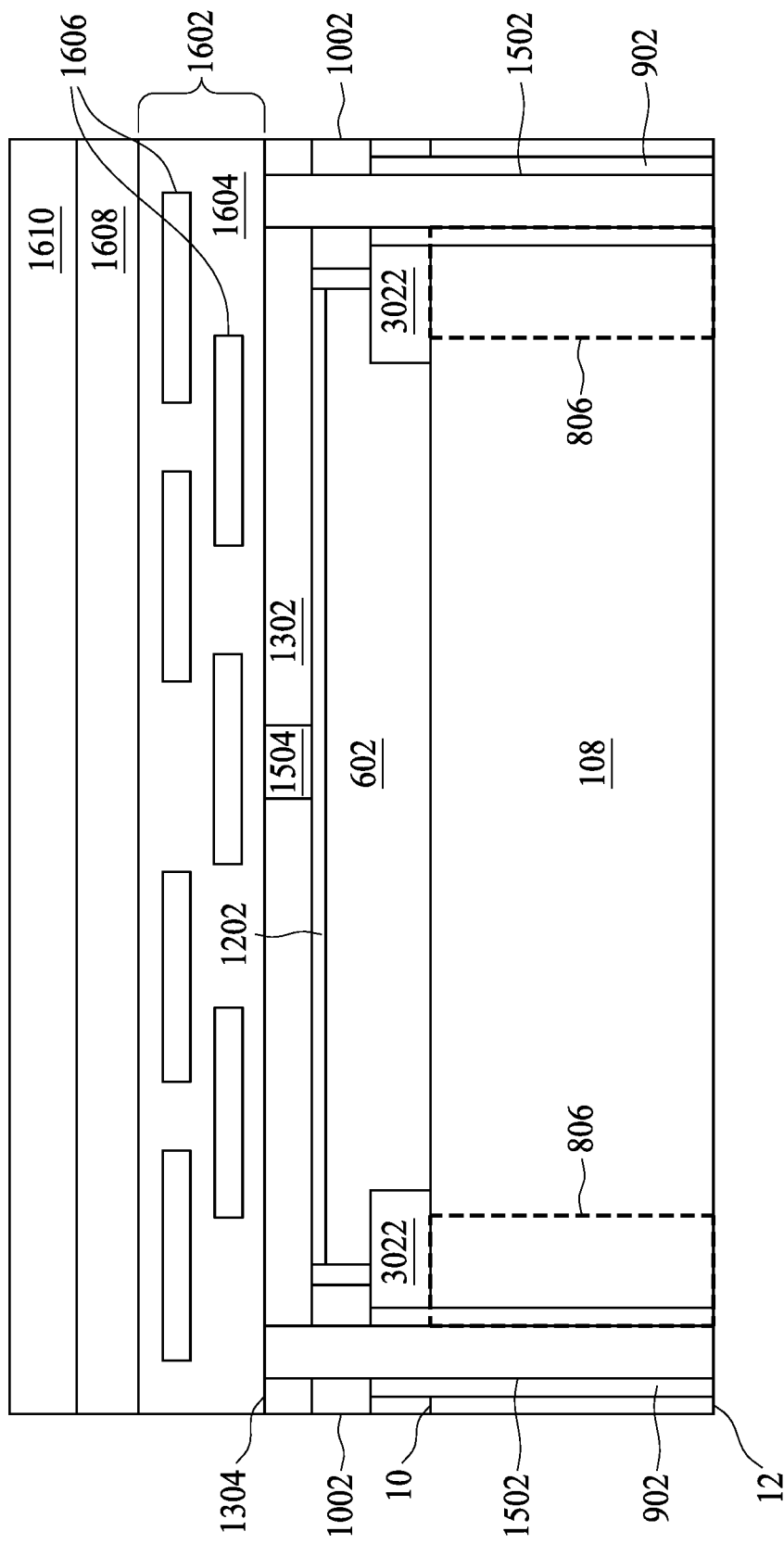

After the metal deposition, an etch, for example, a dry etch, or CMP is carried out for removing residual metal on the top surface of the front side 1304. Additional fabrication processes may be performed to complete the fabrication of the BSI image sensor, as discussed below. Referring to FIG. 16, an interconnect structure 1602 is formed over the front side 1304. The interconnect structure 1602 includes a plurality of patterned dielectric layers and conductive layers that provide interconnections (e.g., wiring) between the various doped features, circuitry, and input/output of the BSI image sensor. The interconnect structure 1602 includes an interlayer dielectric (ILD) 1604 and a multilayer interconnect (MLI) structure 1606. The MLI structure 1606 includes contacts, vias and metal lines. It is understood that the MLI structure shown in 16 is merely for illustrative purpose, and the actual positioning and configuration of the conductive lines and vias/contacts may vary depending on design needs and manufacturing concerns.

The MLI structure 1606 may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), CVD, atomic layer deposition (ALD), or combinations thereof. Other manufacturing techniques to form the aluminum interconnect may include photolithography processing and etching to pattern the conductive materials for vertical connection and horizontal connection. Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect structure may be formed by a technique including CVD, sputtering, plating, or other suitable processes.

Still referring to FIG. 16, a buffer layer 1608 is formed on the interconnect structure 1602. In the present embodiment, the buffer layer 1608 includes a dielectric material such as silicon oxide. Alternatively, the buffer layer 1608 may optionally include silicon nitride. The buffer layer 1608 is formed by CVD, PVD, or other suitable techniques. The buffer layer 1608 is planarized to form a smooth surface by a CMP process.

Thereafter, a carrier substrate 1610 is bonded to the buffer layer 1608, so as to facilitate processing of the back side of the BSI image sensor. The carrier substrate 1610 in the present embodiment includes a silicon material. Alternatively, the carrier substrate 1610 may include a glass substrate or another suitable material. The carrier substrate 1610 may be bonded to the buffer layer 1608 by molecular forces—a technique known as direct bonding or optical fusion bonding—or by other bonding techniques known in the art, such as metal diffusion or anodic bonding.

The buffer layer 1608 provides electrical isolation and protection for the various features formed on the front side of the BSI image sensor. The carrier substrate 1610 also provides mechanical strength and support for processing of the back side of the BSI image sensor as discussed below. After the carrier substrate 1610 is bonded, a thinning process is then performed to thin the BSI image sensor from the backside in FIG. 17. The thinning process may include a mechanical grinding process and a chemical thinning process. A substantial amount of substrate material may be first removed from the substrate 102 during the mechanical grinding process. Afterwards, the chemical thinning process may apply an etching chemical to the back side of the image sensor to further remove the remaining portion of the substrate 102, the lightly doped p-epi layer 104, the heavily doped p-epi layer 106 and a portion of the n-epi layer 108.

Figure 18:
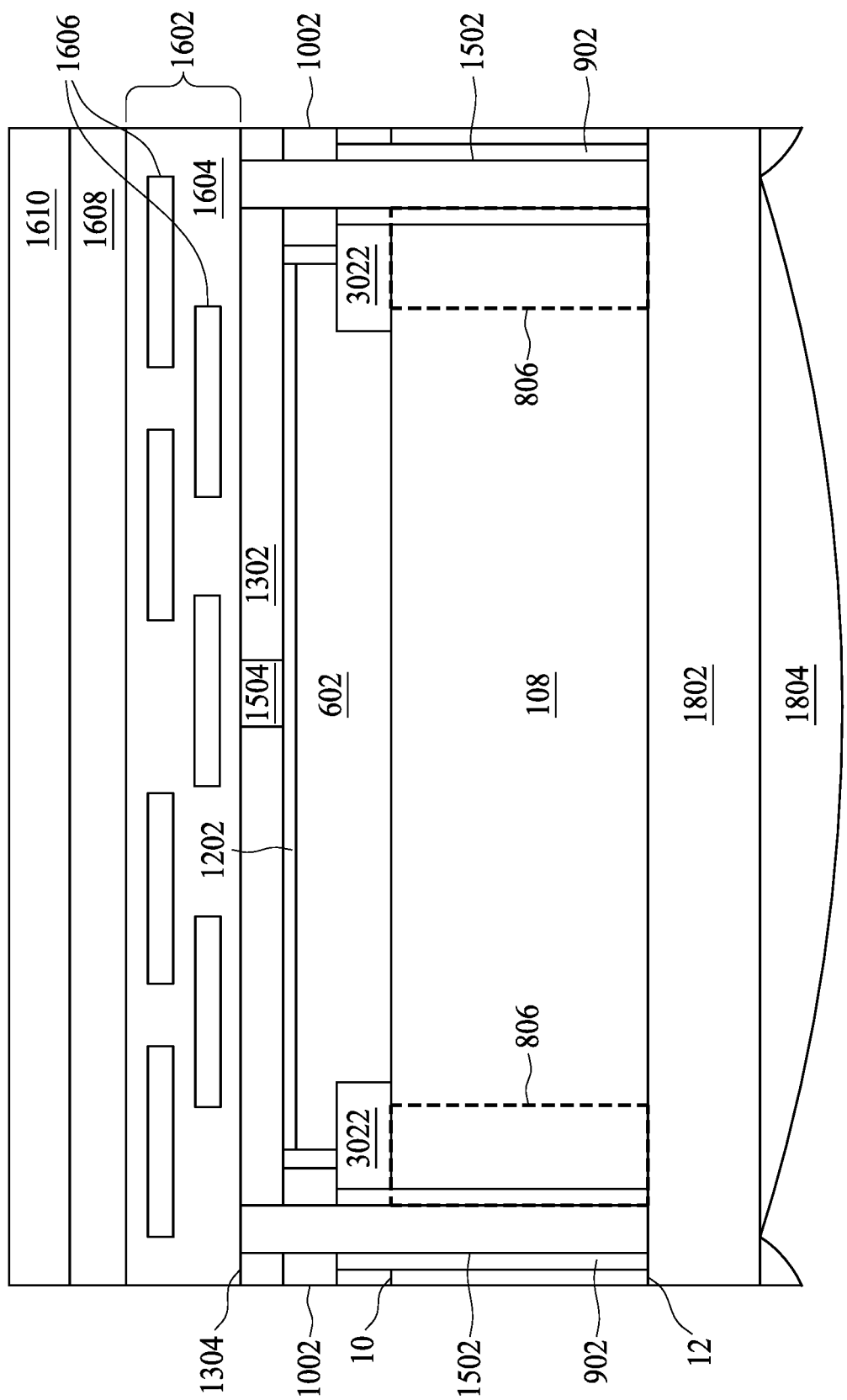

Referring to FIG. 18, a color filter layer 1802 may be formed on the back side of the BSI image sensor. In this embodiment, the color filter layer 1802 contains a plurality of color filters positioned such that the incoming radiation is directed thereon and therethrough. The color filters includes a dye-based (or pigment based) polymer or resin for filtering a specific wavelength band of the incoming radiation, which corresponds to a color spectrum (e.g., red, green, and blue). Thereafter, a micro-lens layer 1804 containing a plurality of micro-lenses is formed over the color filter layer 1802. The micro-lenses direct and focus the incoming radiation toward specific radiation-sensing regions in the BSI image sensor, such as photodiodes. The micro-lenses may be positioned in various arrangements and have various shapes depending on a refractive index of a material used for the micro-lens and distance from a sensor surface.

It is understood that the sequence of the fabrication processes described above is not intended to be limiting. Some of the layers or devices may be formed according to different processing sequences in other embodiments than what is shown herein. Furthermore, some other layers may be formed but are not illustrated herein for the sake of simplicity. For example, an anti-reflection coating (ARC) layer may be formed over the back side of the BSI image sensor before the formation of the color filter layer 1802 and/or the micro-lens layer 1804.

It is also understood that the discussions above pertain mostly to a pixel region of the BSI image sensor. In addition to the pixel region, the image sensor also includes a periphery region, a bonding pad region, and a scribe line region. The periphery region may include devices that need to be kept optically dark. These devices may include digital devices, such as application-specific integrated circuit (ASIC) devices or system-on-chip (SOC) devices, or reference pixels used to establish a baseline of an intensity of light for the BSI image sensor. The bonding pad region is reserved for the formation of bonding pads, so that electrical connections between the BSI image sensor and external devices may be established. The scribe line region includes a region that separates one semiconductor die from an adjacent semiconductor die. The scribe line region is cut therethrough in a later fabrication process to separate adjacent dies before the dies are packaged and sold as integrated circuit chips. For the sake of simplicity, the details of these other regions of the BSI image sensor are not illustrated or described herein.

The above discussions also pertain to a BSI image sensor. However, it is contemplated that the various aspects of the present disclosure may be applied to a front side illuminated (FSI) image sensor as well. For example, the FSI image sensor also uses pixels similar to the pixels discussed herein to detect light, though the light is projected (and enters the substrate) from the front side, rather than the back side. The FSI image sensor does not involve wafer back side thinning processes, and will instead form the color filters and micro-lenses on the front side. The interconnect structure is implemented in a manner so as to not impede or obstruct the path of incident light projected from the front side. It can be seen that the doped isolation regions may also be formed conformal to the dielectric trenches between neighboring pixels using the solid phase or the gas phase dopant diffusion methods discussed herein. As is the case for the BSI image sensor, the conformal doped isolation regions may also enhance the dark current and cross-talk performance of the FSI image sensor. For the sake of simplicity, the processing details of the FSI image sensor are not discussed herein.

The conceptual disclosure provides a novel image sensor structure that precludes the use of ion implantation in the formation of a DTI. As a consequence, several issues introduced by ion implantation can be mitigated.

Some embodiments of the present disclosure provide an image sensor. The image sensor includes an epitaxial layer, a plurality of plug structures and an interconnect structure. Wherein the plurality of plug structures are formed in the epitaxial layer, and each plug structure has doped sidewalls, the epitaxial layer and the doped sidewalls form a plurality of photodiodes, the plurality of plug structures are used to separate adjacent photodiodes, and the epitaxial layer and the doped sidewalls are coupled to the interconnect structure via the plug structures.

In some embodiments of the present disclosure, the epitaxial layer has a doping polarity different from a doping polarity of the doped sidewalls.

In some embodiments of the present disclosure, the doped sidewalls are formed by in-situ epitaxy growth.

In some embodiments of the present disclosure, the doped sidewalk are formed by solid phase doping.

In some embodiments of the present disclosure, the doped sidewalls are formed by gas phase doping.

In some embodiments of the present disclosure, the doped sidewalk are in a conformal manner.

In some embodiments of the present disclosure, the image sensor includes a back side illuminated (BSI) image sensor.

In some embodiments of the present disclosure, the plug structures are filled by depositing metal.

Some embodiments of the present disclosure provide an image sensor. The image sensor includes a first-type doped epitaxial layer, a plug structure, an interconnect structure and a micro-lens. Wherein the plug structure is formed through the first-type doped epitaxial layer, the plug structure is filled by metal and has second-type doped sidewalls, the interconnect structure is coupled to a side of the first-type doped epitaxial layer, the micro-lens is formed over another side of the first-type doped epitaxial layer, the first-type and the second-type are different polarities, and a boundary of the first-type doped epitaxial layer and the second-type doped sidewalls of the plug structure jointly form a p-n junction of a photodiode.

In some embodiments of the present disclosure, the image sensor further has another plug structure formed through the first-type doped epitaxial layer, the another plug structure is filled by metal and has second-type doped sidewalls, and an image pixel of the image sensor is formed between the plug structure and the another plug structure.

In some embodiments of the present disclosure, the doped sidewalls are formed by in-situ epitaxy growth.

In some embodiments of the present disclosure, the doped sidewalls are formed by solid phase doping.

In some embodiments of the present disclosure, the doped sidewalls are formed by gas phase doping.

In some embodiments of the present disclosure, the image sensor includes a back side illuminated (BSI) image sensor.

Some embodiments of the present disclosure provide a method. The method includes: providing a substrate having a first-type doped epitaxial substrate layer on a second-type doped epitaxial substrate layer; forming a plurality of isolation trenches in the first-type doped epitaxial substrate layer; forming a second-type doped region along sidewalls and bottoms of the plurality of isolation trenches; and filling the plurality of isolation trenches by depositing metal.

In some embodiments of the present disclosure, the first-type doped epitaxial substrate layer has a doping polarity different from a doping polarity of the second-type doped region.

In some embodiments of the present disclosure, forming the second-type doped region along sidewalls of the plurality of isolation trenches includes performing in-situ second-type doped epitaxy growth along the sidewalls and bottoms of the plurality of isolation trenches.

In some embodiments of the present disclosure, forming the second-type doped region along sidewalls of the plurality of isolation trenches includes performing solid phase second-type doping.

In some embodiments of the present disclosure, forming the second-type doped region along sidewalk of the plurality of isolation trenches includes performing gas phase second-type doping.

In some embodiments of the present disclosure, the method further includes forming a interconnect structure coupled to the first-type doped epitaxial substrate layer and the plurality of isolation trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a first epitaxial layer having a first side and a second side, wherein the first epitaxial layer has a first type doping polarity, and a doping concentration of the first type doping polarity at the first side is greater than that of the second side;
a second epitaxial layer having the first type doping polarity over the first side of the first epitaxial layer;
an interconnect structure over the second epitaxial layer;
a color filter layer at the second side of the epitaxial layer; and
a plurality of metal plugs passing through the first epitaxial layer; and
a plurality of third epitaxial layers having a second type doping polarity in the first epitaxial layer and encompassing the metal plugs respectively with uniform thickness, wherein the second type doping polarity is different from the first type doping polarity.

2. The image sensor of claim 1, wherein the doping concentration of the first type doping polarity in the first epitaxial layer decreases from the first side toward the second side.

3. The image sensor of claim 1, wherein the metal plugs are free from passing through the second epitaxial layer.

4. The image sensor of claim 1, wherein the metal plugs protrude from the first side of the first epitaxial layer and are in physical contact with the interconnect structure at one end, and are level with the second side of the first epitaxial layer and in physical contact with the color filter at the other end.

5. The image sensor of claim 1, wherein the third epitaxials are formed by in-situ epitaxy growth.

6. The image sensor of claim 1, wherein the third epitaxials are formed by solid phase doping.

7. The image sensor of claim 1, wherein the third epitaxials are formed by gas phase doping.

8. The image sensor of claim 1, wherein the third epitaxials are in a conformal manner.

9. An image sensor, comprising:
a first epitaxial layer of a first type doping polarity having a first side and a second side;
a second epitaxial layer of the first type doping polarity over the first side of the first epitaxial layer;
an interconnect structure over the second epitaxial layer;

a color filter layer in physical contact with the second side of the first epitaxial layer; and a metal plug formed through the first epitaxial layer, and the metal plugs extending to a higher level than the first side of the first epitaxial layer and in physical contact with the interconnect structure at one end, and being level with the second side of the first epitaxial layer and in physical contact with the color filter at the other end;

a third epitaxial of a second type doping polarity conformally formed around the metal plug, wherein the second type doping polarity is different from the first type doping polarity; and a micro-lens formed over the second side of the first epitaxial layer.

10. The image sensor of claim 9, wherein the doping concentration of the first type doping polarity in the first epitaxial layer decreases from the first side toward the second side.

11. The image sensor of claim 9, wherein the metal plug is free from passing through the second epitaxial layer.

12. The image sensor of claim 9, wherein the image sensor further has another metal p formed through the first epitaxial layer, and an image pixel of the image sensor is formed between the metal plug and the another metal plug.

13. The image sensor of claim 9, wherein the third epitaxials are formed by in-situ epitaxy growth.

14. The image sensor of claim 9, wherein the third epitaxials are formed by solid phase doping.

15. A method of fabricating an image sensor, comprising:
providing a first epitaxial layer, wherein the first epitaxial layer has a first side and a second side;
depositing a second epitaxial layer over the first epitaxial layer;
etching away a portion of the second epitaxial layer to expose a portion of the first side of the first epitaxial layer;
forming a plurality of isolation trenches in the first epitaxial layer;
forming a doped layer along sidewalls and bottoms of the plurality of isolation trenches;
filling the plurality of isolation trenches by depositing a dielectric material in and over the isolation trenches;
removing at least a portion of the dielectric material in the isolation trenches;
filling the plurality of isolation trenches by depositing metal to form a plurality of metal plugs;
forming an interconnect structure over the second epitaxial layer; and
performing a thinning process upon the second side of the first epitaxial layer to expose the metal plugs;
forming a color filter layer at the second side of the first epitaxial layer.

16. The method of claim 15, wherein the first epitaxial layer has a doping polarity different from a doping polarity of the doped layer.

17. The method of claim 15, wherein forming the doped layer along sidewalls and bottoms of the plurality of isolation trenches comprises performing in-situ epitaxy growth along the sidewalls and bottoms of the plurality of isolation trenches.

18. The method of claim 15, wherein forming the doped layer along sidewalls and bottoms of the plurality of isolation trenches comprises performing solid phase dopant diffusion.

19. The method of claim 15, wherein forming the doped layer along sidewalls and bottoms of the plurality of isolation trenches comprises performing gas phase dopant diffusion.

20. The method of claim 15, wherein forming the interconnect structure over the second epitaxial layer comprises:
forming the interconnect structure over second epitaxial layer and in physical contact with one end of the metal plugs.

* * * * *